(12) United States Patent
Yoon

(10) Patent No.: US 8,004,015 B2
(45) Date of Patent: Aug. 23, 2011

(54) SEMICONDUCTOR MEMORY DEVICE HAVING L-SHAPED CELL BLOCKS ARRANGED IN DIAGONAL DIRECTION INTERSECTING THE HORIZONTAL AND VERTICAL DIRECTIONS

(75) Inventor: HongSik Yoon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 91 days.

(21) Appl. No.: 12/633,943

(22) Filed: Dec. 9, 2009

(65) Prior Publication Data
US 2010/0140666 A1    Jun. 10, 2010

(30) Foreign Application Priority Data
Dec. 10, 2008 (KR) .................. 10-2008-0125249

(51) Int. Cl.
*H01L 27/118* (2006.01)

(52) U.S. Cl. .......... 257/202; 257/210; 257/324; 365/97; 365/230.06

(58) Field of Classification Search ................... 257/210; 365/97
See application file for complete search history.

(56) References Cited

U.S. PATENT DOCUMENTS

| 6,545,900 | B2 | 4/2003 | Bohm et al. |
| 2002/0075718 | A1* | 6/2002 | Bohm et al. ................. 365/97 |
| 2005/0105371 | A1* | 5/2005 | Johnson et al. ........... 365/230.06 |

FOREIGN PATENT DOCUMENTS

| JP | 2002-164515 | 6/2002 |
| JP | 2007-200963 | 8/2007 |

* cited by examiner

*Primary Examiner* — Stephen W Smoot
*Assistant Examiner* — Khaja Ahmad
(74) *Attorney, Agent, or Firm* — Myers Bigel Sibley & Sajovec

(57) ABSTRACT

Semiconductor devices are provided including a plurality of L-shaped cell blocks each including, a cell array and a plurality of decoders disposed in horizontal and vertical directions of the cell array. The plurality of L-shaped cell blocks are oriented in a diagonal direction intersecting the horizontal and vertical directions. Related methods are also provided herein.

12 Claims, 18 Drawing Sheets

$L_1 : M_1 = 2:1$
($L_2 : M_2 = 2:1$)

$L_1 : M_1 \neq 2:1$
$(L_2 : M_2 \neq 2:1)$ $N_1 : N_2 = 2:1$ $N_1 : N_2 \neq 2:1$ $D_1 : D_2 = 2 : 1$ $E_1 : E_2 = 2 : 1$

SEMICONDUCTOR MEMORY DEVICE HAVING L-SHAPED CELL BLOCKS ARRANGED IN DIAGONAL DIRECTION INTERSECTING THE HORIZONTAL AND VERTICAL DIRECTIONS

CLAIM OF PRIORITY

This application claims priority to Korean Patent Application 10-2008-0125249, filed Dec. 10, 2008, the contents of which hereby incorporated by reference as if set forth in its entirety.

FIELD

The present invention relates to semiconductors and, more particularly, to semiconductor devices and methods of arranging cell blocks thereof.

BACKGROUND

A demand for high-density memories has increased with an advance in a semiconductor fabrication technology. U.S. Pat. No. 6,545,900 discusses a technique for realizing high-density packing of memory cell blocks. As illustrated in FIG. 1A, cross-shaped memory cell blocks 10 including a memory cell array A and peripheral circuits P surrounding the memory cell array A are arranged in an offset manner. When the memory cell blocks 10 are arranged in a typical manner, as illustrated in FIG. 1B, empty spaces 14 are formed between the memory cell blocks 10. Therefore, chip area may be wasted. Furthermore, as the area of the peripheral circuits P increases, the amounted of wasted chip area increases as illustrated in FIG. 1C. To address this issue, U.S. Pat. No. 6,545,900 suggests arranging the memory cell blocks 10 in the offset manner to restrain the occurrence of the empty spaces 14.

The technique discussed in U.S. Pat. No. 6,545,900 may realize the high-density packing, only when a ratio of a length $L_1$ of the horizontal side in each memory cell array A to a length $M_1$ of the horizontal side in each peripheral circuit P is 2 to 1 or only when a ratio of a length L of the vertical side in each memory cell array A to a length of the vertical side in each peripheral circuit P is 2 to 1. For example, as illustrated in FIG. 1D, the empty spaces 14 occur between the memory cell blocks 10 in a case of $L_1:M_1 \neq 2:1$ or $L_2:M_2 \neq 2:1$. For this reason, in this technique there may be a restriction on the length of the memory cell block for the purpose of realizing the density arrangement of the memory cell blocks 10.

As further discussed in Japanese Patent Publication NO. 2007-200963 and illustrated in FIG. 1E, memory cell blocks 20 are designed in an "L" shape and the memory cell blocks 20 are arranged in a point-symmetric manner. However, in this technique the memory cell blocks 20 are closely arranged to realize the high-density packing only when a length $L_1$ of the longer side in each memory cell block 20 is about the double of a length $L_2$ of the shorter side thereof. For example, as illustrated in FIG. 1F, an empty space 24 occurs between the memory cell blocks 20 in a case of $N_1:N_2 \neq 2:1$. Therefore, Japanese Patent Publication NO. 2007-200963 also has the restriction on the length of each memory cell block 20 for the purpose of realizing the dense arrangement with no empty space 24, like U.S. Pat. No. 6,545,900.

SUMMARY

Some embodiments of the present invention provide semiconductor devices including a plurality of L-shaped cell blocks each including a cell array and a plurality of decoders disposed in horizontal and vertical directions of the cell array. The plurality of L-shaped cell blocks are oriented in a diagonal direction intersecting the horizontal and vertical directions.

In further embodiments of the present invention, the cell array may have a tetragonal shape with first to fourth vertexes which are sequentially arranged.

In still further embodiments of the present invention, the decoder may include a first tetragonal decoder which is disposed in the horizontal direction of the cell array to be adjacent to a side connecting the second vertex to the third vertex; and a second tetragonal decoder which is disposed in the vertical direction of the cell array to be adjacent to a side connecting the third vertex to the fourth vertex.

In some embodiments of the present invention, the cell block may further include a first conjunction region which is disposed in the horizontal direction of the cell array to be adjacent to the first decoder and connects a peripheral circuit operating the cell block to the first decoder; and a second conjunction region which is disposed in the vertical direction of the cell array to be adjacent to the second decoder and connects the peripheral circuit to the second decoder.

In further embodiments of the present invention, the device may further include a first wiring which is electrically connected to the first conjunction region to select the first decoder; and a second wiring which is electrically connected to the second conjunction region to select the second decoder.

In still further embodiments of the present invention, a first vertex of one of two cell arrays closest to each other may come in contact with a third vertex of the other cell array to form the diagonal direction.

In some embodiments of the present invention, a ratio of the lengths of opposite sides in the plurality of L-shaped cell blocks may be 2:1, and a pair of closest cell blocks in the plurality of L-shaped cell blocks may be point-symmetric with each other.

Further embodiments of the present invention provide semiconductor devices include a plurality of memory cell blocks each having a memory cell array where a plurality of memory cells are arrayed and row and column decoders for accessing the memory cells. The row and column decoders are disposed in horizontal and vertical directions of the memory cell array so that the plurality of memory cell blocks forms an L shape. Any one of the plurality of L-shaped memory cell blocks comes in contact with the row and column decoders of another L-shaped memory cell block.

In still further embodiments of the present invention, each of the plurality of L-shaped memory cell blocks may further include a first conjunction region which is disposed in the horizontal direction at one side of the row decoder to connect a peripheral circuit operating the memory cell block to the row decoder; and a second conjunction region which is disposed in the horizontal direction at one side of the column decoder to connect the peripheral circuit to the column decoder.

In some embodiments of the present invention, a first wiring which is electrically connected to the plurality of first conjunction regions to select at least one of the plurality of row decoders; and a second wiring which is electrically connected to the plurality of second conjunction regions to select at least one of the plurality of column decoders.

In further embodiments of the present invention, the plurality of cell arrays may be adjacent to each other in a diagonal direction intersecting the horizontal and vertical directions.

In still further embodiments of the present invention, any one of the plurality of L-shaped memory cell blocks may be point-symmetric to another L-shaped memory cell block.

Although embodiments of the present invention are discussed above with respect to device embodiments, related methods are also provided herein.

BRIEF DESCRIPTION OF THE DRAWINGS

The accompanying drawings are included to provide a further understanding of the present invention, and are incorporated in and constitute a part of this specification. The drawings illustrate example embodiments of the present invention and, together with the description, serve to explain principles of the present invention. In the drawings.

DETAILED DESCRIPTION OF EMBODIMENTS

Figure 1A:
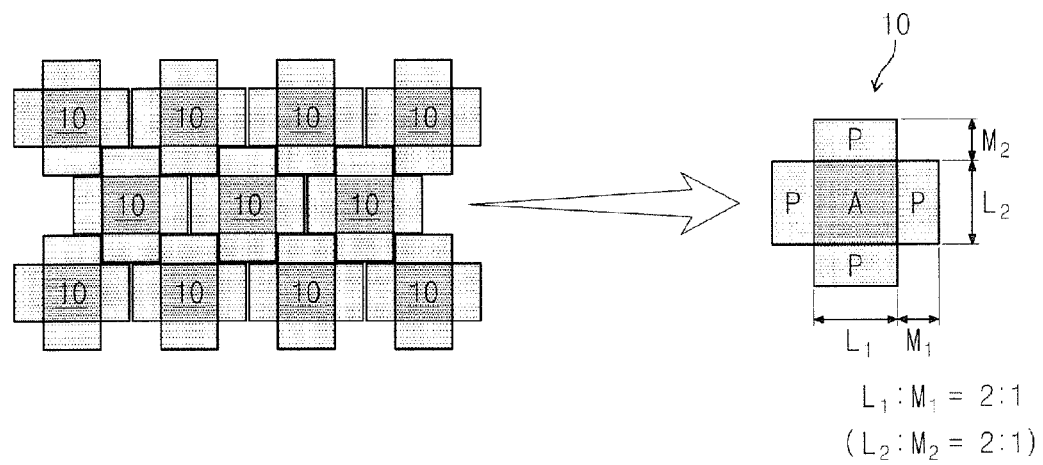
FIGS. 1A to 1F are plan views illustrating conventional arrangements of memory cell blocks.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "lower" and "upper" or "upper," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2A:
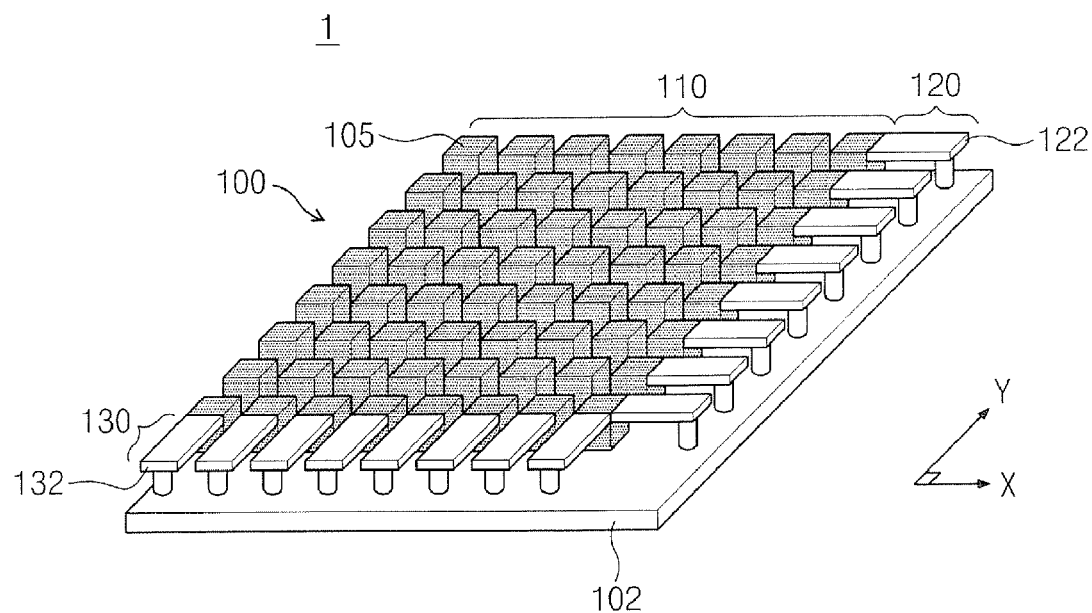
FIG. 2A is a perspective view illustrating semiconductor devices according to some embodiments of the present invention.
Figure 2B:
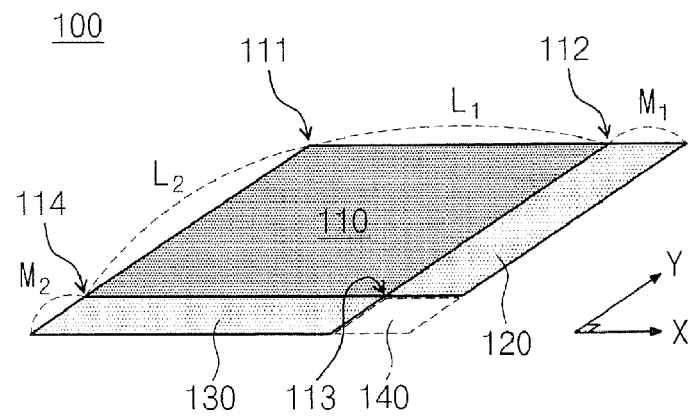
FIG. 2B is a perspective view illustrating cell blocks according to some embodiments of the present.

FIG. 2A is a perspective view illustrating semiconductor devices according to some embodiments of the present invention will be discussed. FIG. 2B is a perspective view illustrating cell blocks according to some embodiment of the present invention. Referring to FIGS. 2A and 2B, the semiconductor device 1 according to some embodiments of the present invention may include a cell block 100 including a cell array 110 and an X-decoder 120 and a Y-decoder 130 assigned to the cell array 110. The cell array 110 may include a plurality of cells 105 arranged on a semiconductor substrate 102 in X- and Y-directions. The cell 105 may serve as a memory cell such as a Dynamic Random Access Memory (DRAM) or a FLASH memory including at least one word line extending in the X-direction and at least one bit line extending in the Y-direction. The cell array 110 may have a tetragonal shape with a horizontal side of length $L_1$ and a vertical side of length $L_2$ and with first to fourth vertexes 111 to 114. The cell array according to various embodiments of the present invention generally has the tetragonal shape, but it is assumed in this specification that the cell array has a square shape for convenience. It will be understood that the cell array may have a rectangular shape or a polygonal shape without departing from the scope of the present invention.

The X-decoder 120 is a part of a peripheral area including a decoder circuit 122 for selecting the word line of the cell array 110 and may serve as a row decoder. The Y-decoder 130 is another part of the peripheral area including a decoder circuit 132 for selecting the bit line of the cell array 110 and may serve as a column decoder. The X-decoder 120 may have a tetragonal shape with a horizontal side of length $M_1$ and a vertical side of length $L_2$. The Y-decoder 130 may have a tetragonal shape with a horizontal side of length $L_1$ and a vertical side of length $M_2$.

For example, as illustrated in Table 1 below, the cell array 110 has a square shape having an area of $L_1 \times L_2$ where $L_1 = L_2$. The X-decoder 120 has a rectangular shape having an area of $M_1 \times L_2$ where $M_1 < L_2$. The Y-decoder 130 has a rectangular shape having an area of $L_1 \times M_2$ where $M_2(=M_1) < L_1(=L_2)$. That is, the X-decoder 120 and the Y-decoder 130 may have the rectangular shape having the same area. In addition, the X-decoder 120 comes in contact with the right side connecting the second vertex 112 of the cell array 110 to the third vertex 113 thereof. The Y-decoder 130 comes in contact with the lower side connecting the third vertex 113 of the cell array 110 to the fourth vertex 114 thereof. That is, the cell block 100 has "a reversed L shape or "an L shape" which is a lateral symmetry with respect to a line connecting the first vertex 111 to the third vertex 113.

Figure 2C:
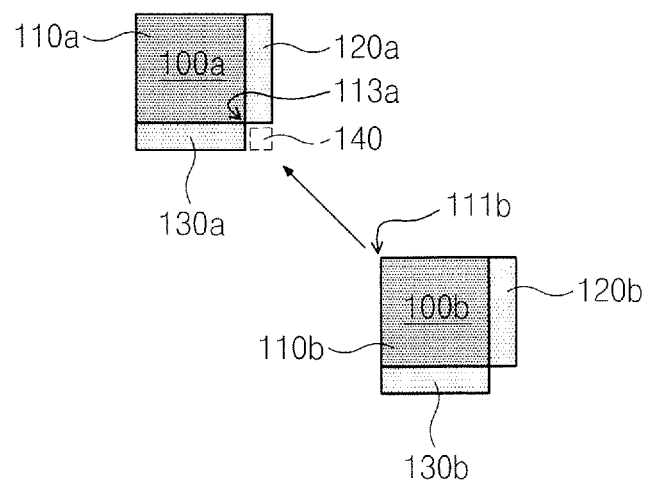
FIGS. 2C to 2E are plan views illustrating methods of arranging the cell blocks according to some embodiments of the present invention.
Figure 2D:
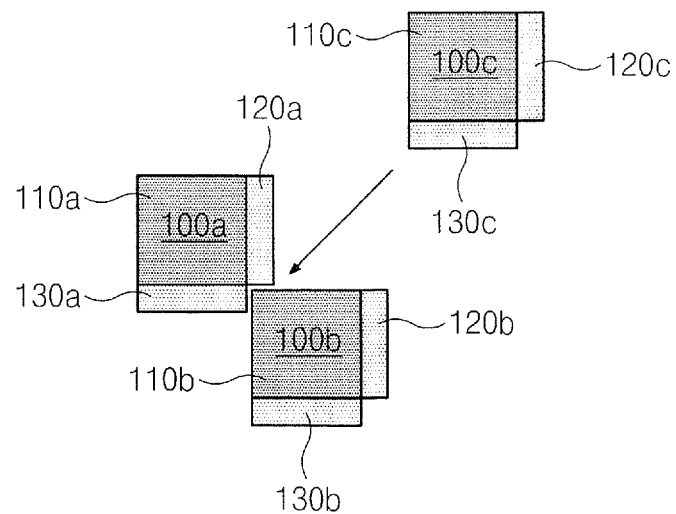
Figure 2E:
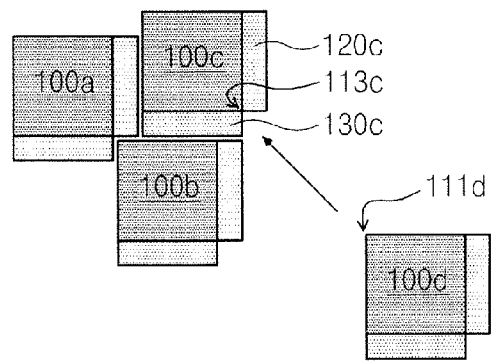

FIGS. 2C to 2E are plan views illustrating methods of arranging the cell blocks according to some embodiment of the present invention. In FIGS. 2C to 2E, the plurality of cell blocks are distinguished as first to fourth cell blocks 100a to 100d for convenience, and a, b, c, and d attached to the ends of reference numerals denote elements of the first to fourth cell blocks 100a to 100d.

With reference to FIG. 2C, a certain corner of the second cell block 100b may be adjacent to a certain corner of the first cell block 100a. For example, the second cell array 110b may be arranged to come in contact with a first X-decoder 120a and a first Y-decoder 130a. In these embodiments, a third vertex 113a of the first cell block 100a comes in contact with a first vertex 111b of the second cell block 100b. The empty space 140 may be configured to be occupied by the cell array 110b of the second cell block 100b. As a consequence, the first cell block 100a and the second cell block 100b are arranged diagonally.

With reference to FIG. 2D, the third cell block 100c may be arranged on the right side of the first cell block 100a and on the upper side of the second cell block 100b. For example, the third cell array 110c comes in contact with the first X-decoder 120a, and a third Y-decoder 120c comes in contact with the second cell array 110b and a second X-decoder 120b. As a consequence, no empty space occurs between the first to third cell blocks 100a to 100c.

With reference to FIG. 2E, a certain corner of the fourth cell block 100d may be arranged in a certain corner of the third cell block 100c. For example, the fourth cell array 110d is arranged to be adjacent to a third X-decoder 120c and a third Y-decoder 130c. In these embodiments, a first vertex 111d of the fourth cell block 100d comes in contact with a third vertex 113c of the third cell block 100c. The third cell block 100c and the fourth cell block 100d are arranged diagonally. As a consequence, no empty space occurs between the first to fourth cell blocks 100a to 100d. In order to realize the high packing density, in some embodiments all the first to fourth cell blocks 100a to 100d are arranged in the reversed L shape or the L shape.

Figure 2F:
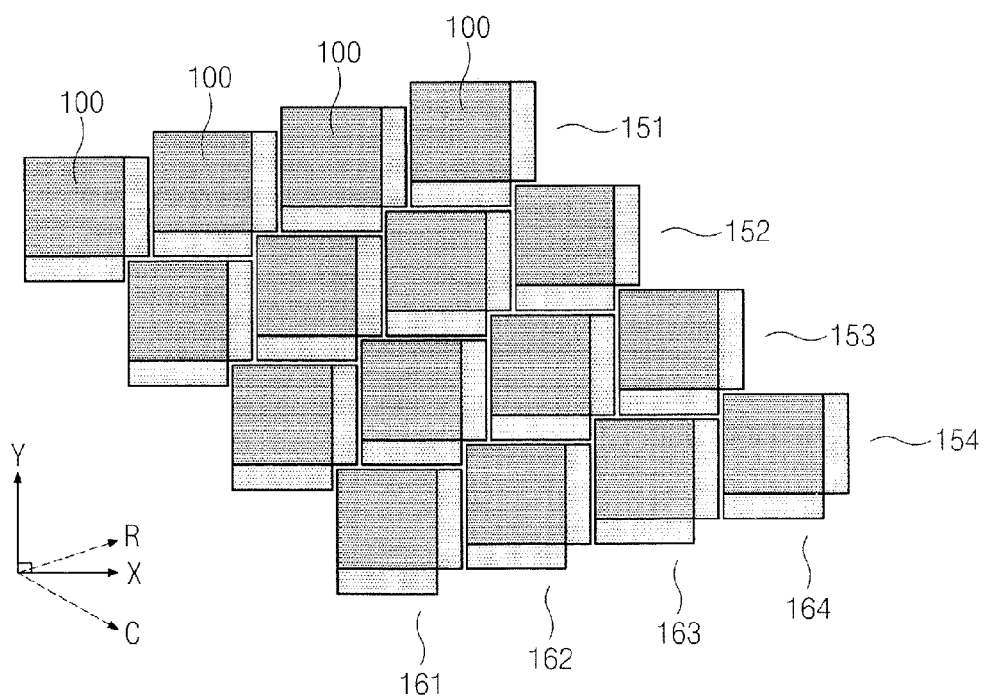
FIGS. 2F is a plan view illustrating the closely-packed arranged cell blocks according to some embodiments of the present invention.

FIG. 2F is a plan view illustrating the cell blocks closely-packed arranged similar to the arrangement illustrated in FIGS. 2C to 2E. Referring to FIG. 2F, the plurality of cell blocks 100 are arranged to form a plurality of rows 151 to 154 in an R-direction and a plurality of columns 161 to 164 in a C-direction by using the arrangement described with reference to FIGS. 2C to 2E. Here, the C-direction and the R-direction in which the plurality of cell blocks 100 are arranged may intersect the X-direction and the Y-direction. In this

TABLE 1

| | HORIZONTAL | VERTICAL | AREA | SHAPE |
|---|---|---|---|---|
| CELL ARRAY 110 | $L_1$ | $L_2 (=L_1)$ | $L_1 \times L_2$ | SQUARE |
| X-DECODER 120 | $M_1$ | $L_2$ | $M_1 \times L_2$ | RECTANGULAR |
| Y-DECODER 130 | $L_1$ | $M_2 (=M_1)$ | $L_1 \times M_2$ ($M_1 \times L_2$) | RECTANGULAR |

Figure 1B:
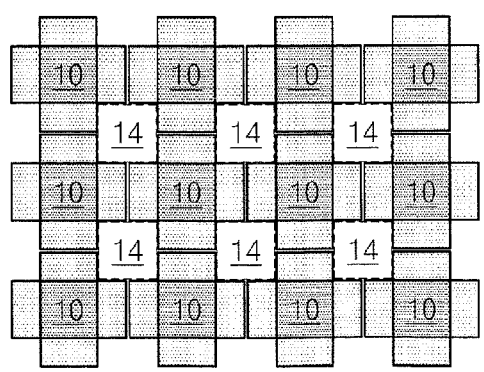
Figure 1C:
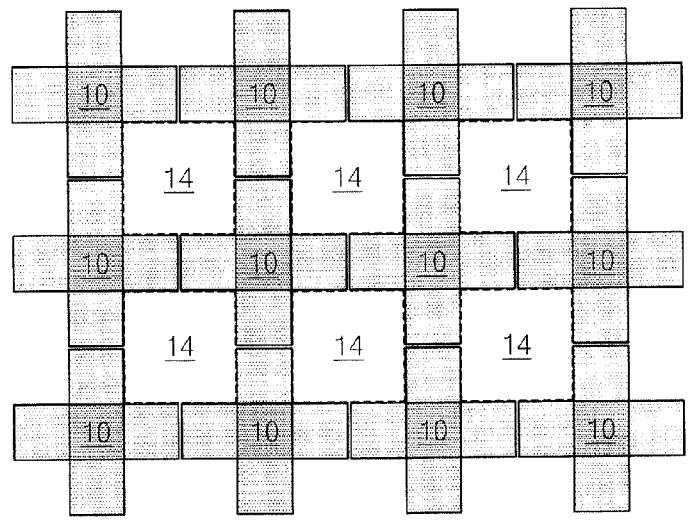
Figure 1D:
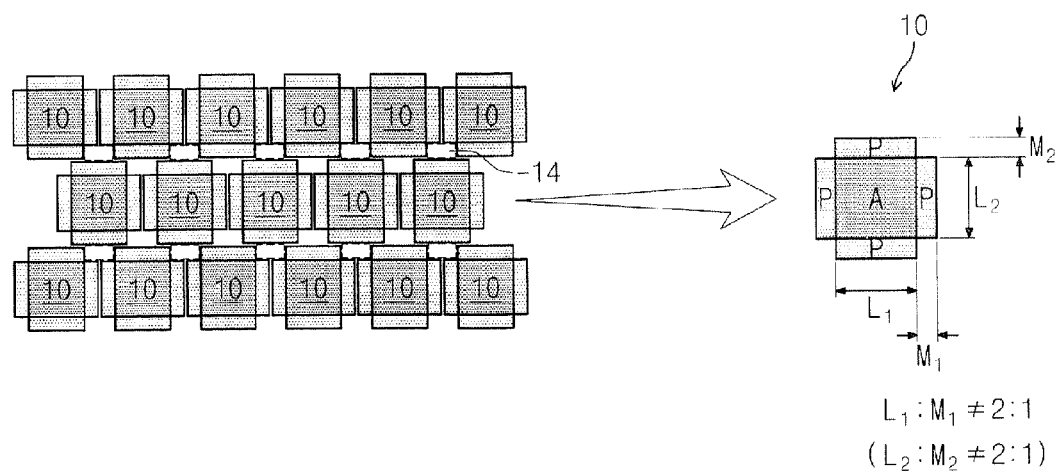

When the symmetric L-shaped cell blocks 100 are arranged in the same manner as the conventional art illustrated in FIG. 1B, an empty space 140 occurs outside the third vertex 113, thereby wasting a chip area. According to some embodiments, the cell blocks 100 can be closely arranged without the empty space 140 by arranging the cell blocks 100 in the same manner as described with reference to FIGS. 2C to 2E. In this way, the high packing density can be realized.

specification, the X-direction is defined as a horizontal direction, the Y-direction is defined as a vertical direction, and the C-direction and the R-direction are defined as a diagonal direction.

For example, left top corners of the plurality of cell blocks 100 forming a second horizontal row 152 may come in contact with right bottom corners of the plurality of cell blocks 100 forming a first horizontal row 151, respectively. In addition, left top corners of the plurality of cell blocks 100 forming the third horizontal row 153 may come in contact with right bottom corners of the plurality of cell blocks 100 forming the second horizontal row 152, respectively. With the same arrangement, left top corners of the plurality of cell blocks 100 forming a fourth horizontal row 154 may come in contact with right bottom corners of the plurality of cell blocks 100 forming the third horizontal row 153, respectively. The plurality of cell blocks 100 forming first to fourth columns 161 to 164 may be arranged in the diagonal direction.

Figure 1E:
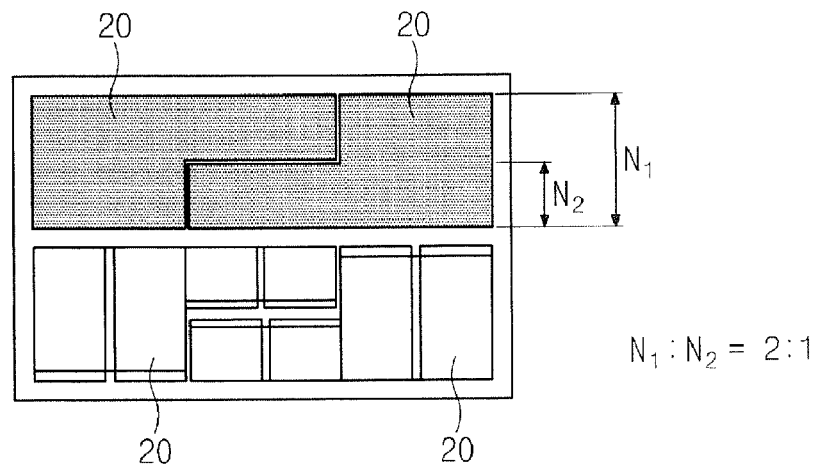
Figure 1F:
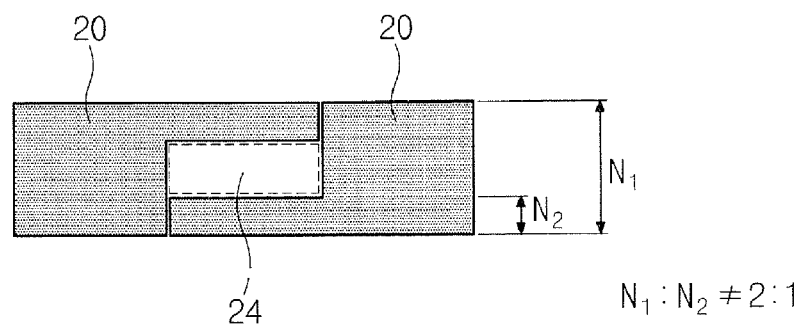

According to the above arrangement, there is no empty space between the plurality of cell blocks 100. Therefore, the area may be efficiently used. In particular, according to these embodiments, the cell blocks 100 are irrelevant to the length condition of the existing close arrangement illustrated in FIG. 1A or 1E. Accordingly, even when the size (area) of the decoder is enlarged by decreasing the pitch of the cell arrays or by stacking the cell arrays, the cell blocks can be closely arranged, thereby realizing a high packing density.

Figure 3A:
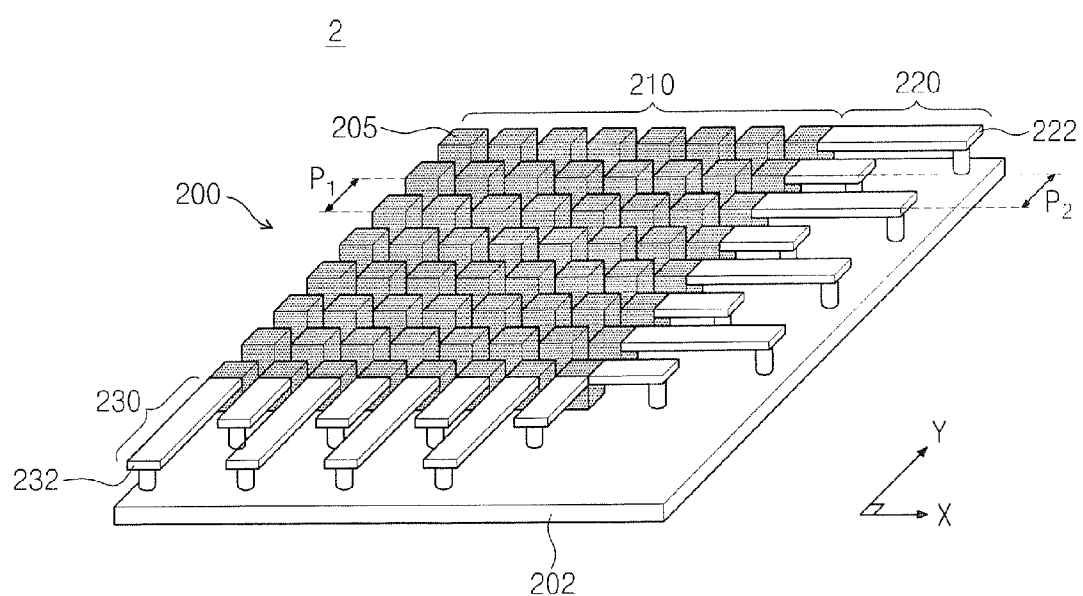
FIG. 3A is a perspective view illustrating semiconductor devices according some embodiments of the present invention.
Figure 3B:
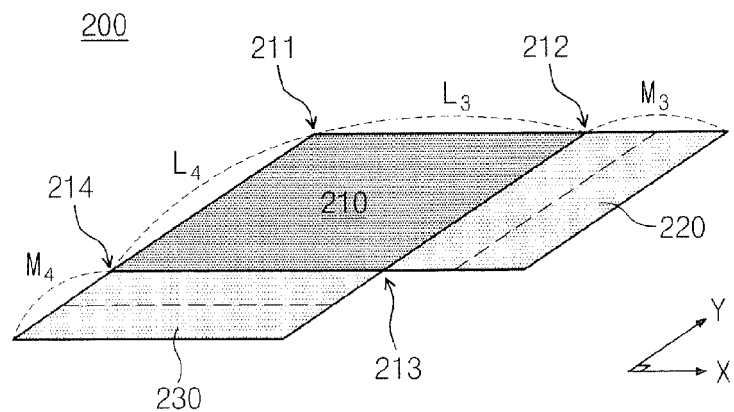
FIG. 3B is a perspective view illustrating cell blocks according to some embodiments of the present invention.

FIG. 3A is a perspective view illustrating a semiconductor device including cell blocks according to some embodiments of the present invention. FIG. 3B is a diagram illustrating the configuration of the cell blocks according to some embodiments of the present invention. Referring now to FIGS. 3A and 3B, semiconductor device 2 according to some embodiments of the present invention may include a cell block 200 which has a cell array 210, an X-decoder 220, and a Y-decoder 230. The cell array 210 includes a plurality of memory cells 205 arranged in the X-direction and the Y-direction on a semiconductor substrate 202, the X-decoder 220 includes a decoder circuit 222 for selecting a word line extending in the X-direction, and the Y-decoder 230 includes a decoder circuit 232 for selecting a bit line extending in the Y-direction.

With an advance in a semiconductor manufacturing technique, the size of the memory cell 205 may decrease. A pitch $P_1$ between transistors forming the memory cell 205 may decrease, as the size of the memory cell 205 decreases. However, a pitch $P_2$ of transistors forming the X-decoder 220 may not decrease by the rate of the decrease in the pitch $P_1$. Therefore, since all the decoder circuits 222 may not be manufactured in a limited area, some of lines comprising the decoder circuit 222 may extend longer. As a consequence, the X-decoder 220 including a plurality of decoder areas may extend in the X-direction. Then, the size of the X-decoder 220 may increase in the X-direction. The same is applied to the Y-decoder 230. The size of the Y-decoder 230 may increase in the Y-direction.

The cell array 210 has a horizontal side of length $L_3$ and a vertical side of length $L_4$ and may have a tetragonal shape with first to fourth vertexes 211 to 214. The X-decoder 220 may have a tetragonal shape with a horizontal side of length $M_3$ and a vertical side of $L_4$. The Y-decoder 230 may have a tetragonal shape with a horizontal side of length $L_3$ and a vertical side of $M_4$.

For example, it is assumed that $L_3=L_1$, $L_4=L_2$, $M_3>M_1$, and $M_4>M_2$ to make a comparison with the cell block 100 in FIG. 2B. As illustrated in Table 2, the cell array 210 has a square shape having an area of $L_3 \times L_4$, where $L_3=L_4$. The X-decoder 220 has a rectangular shape having an area of $M_3 \times L_4$, where $M_3<L_4$. The Y-decoder 230 has a rectangular shape having an area of $L_3 \times M_4$, where $M_4(=M_3)<L_3(=L_4)$. That is, the X-decoder 220 and the Y-decoder 230 may have the rectangular shape having the same area. In addition, the X-decoder 220 comes in contact with the right side connecting the second vertex 212 of the cell array 210 to the third vertex 213 thereof. The Y-decoder 230 comes in contact with the lower side connecting the third vertex 213 of the cell array 210 to the fourth vertex 214 thereof. That is, the cell block 200 according to some embodiments of the present invention has "a reversed L shape" or "an L shape" which is the same symmetric structure as the cell block 100 illustrated in FIG. 2B. The area $L_3 \times L_4$ of the cell array 210 is equal to the area $L_1 \times L_2$ of the cell array 110. The X-decoder 220 and the Y-decoder 230 have the sizes (areas) larger than the X-decoder 120 and the Y-decoder 130, respectively.

TABLE 2

|  | HORIZONTAL | VERTICAL | AREA | SHAPE |
| --- | --- | --- | --- | --- |
| CELL ARRAY 210 | $L_3$ | $L_4 (=L_3)$ | $L_3 \times L_4$ | SQUARE |
| X-DECODER 220 | $M_3$ | $L_4$ | $M_3 \times L_4$ | RECTANGULAR |
| Y-DECODER 230 | $L_3$ | $M_4 (=M_3)$ | $L_3 \times M_4$ ($M_3 \times L_4$) | RECTANGULAR |

Figure 3C:
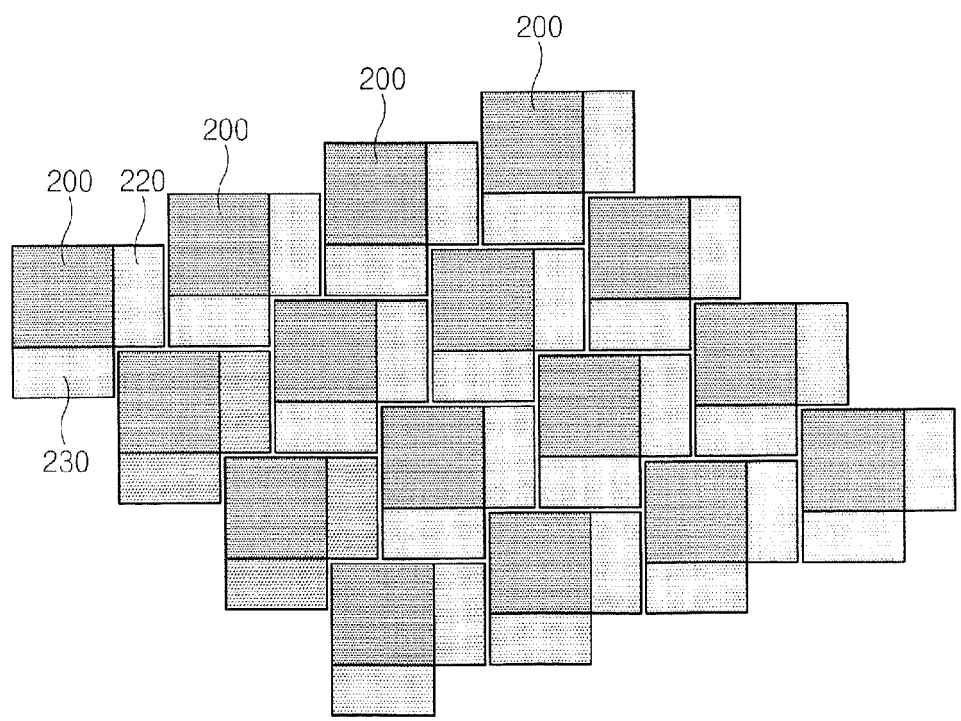
FIG. 3C is a plan view illustrating the closely-packed arranged cell blocks according to some embodiments of the present invention.

FIG. 3C is a plan view illustrating the closed-packed arrangement of the plurality of cell blocks according to some embodiment of the present invention. As illustrated in FIG. 3C, the plurality of cell blocks 200 may be closely arranged without an empty area between the cell blocks, when the arrangement is conducted with reference to FIGS. 2C to 2E. As discussed above, the size (area) of the X-decoder 220 and the Y-decoder 230 may increase, as the design rule decreases. In these embodiments, when the cell blocks 200 are designed in the cross shape and arranged in the way described with reference to FIG. 1B of the conventional art, an empty area is formed between the cell blocks 200, thereby causing the waste of the chip area. In some embodiments of the present invention, however, the cell blocks 200 are designed in the reversed L shape or the L shape. Therefore, as illustrated in FIG. 3C, the cell blocks 200 may be closely arranged without an empty area.

Figure 4A:
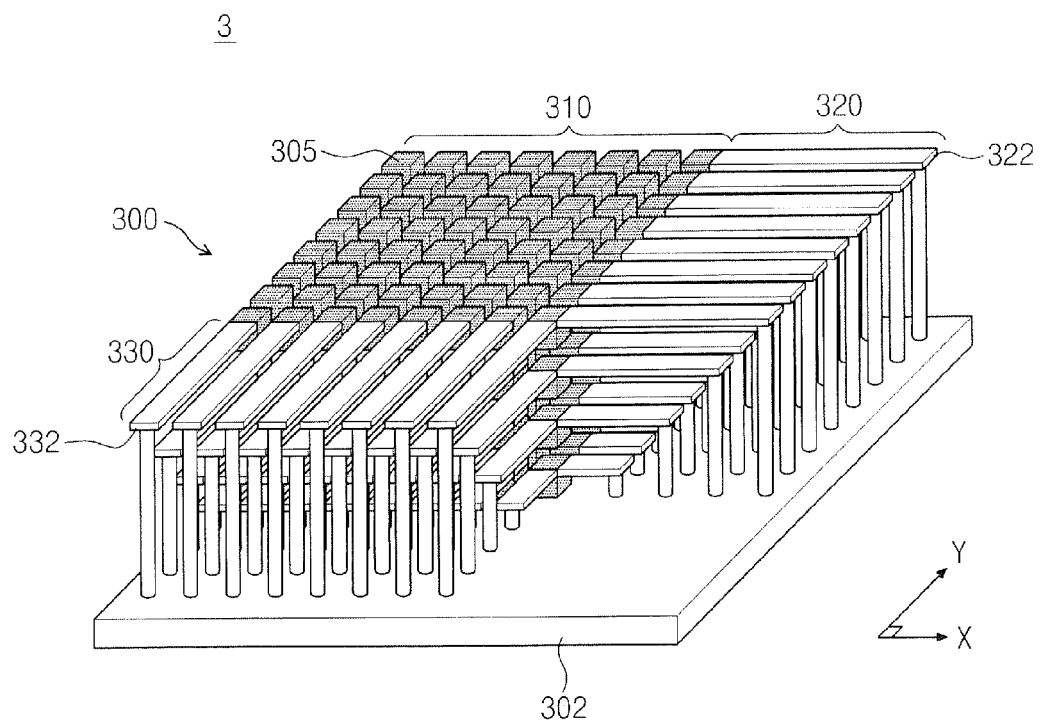
FIGS. 4A through 4C are perspective views illustrating semiconductor devices according some embodiments of the present invention.
Figure 4B:
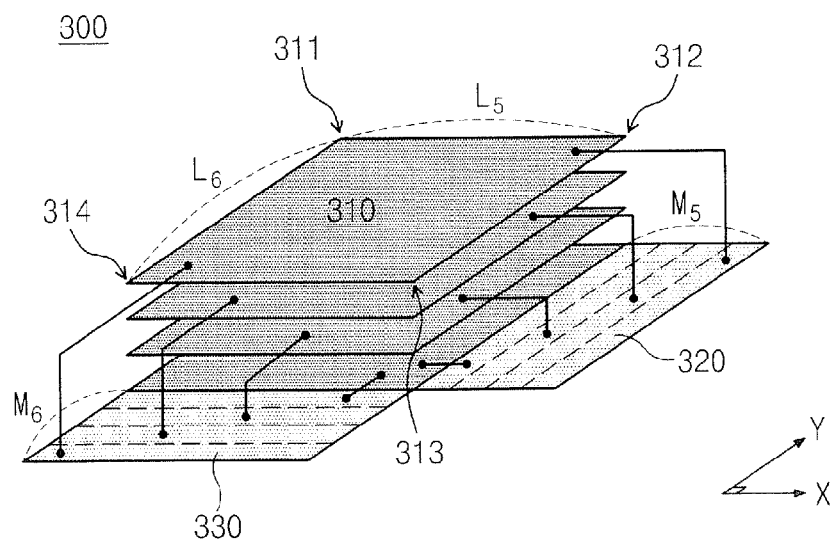

FIG. 4A is a perspective view illustrating a semiconductor device including cell blocks according to some embodiments of the present invention. FIG. 4B is a diagram illustrating the configuration of the cell block according to some embodiments of the present invention. As illustrated in FIGS. 4A and 4B, a semiconductor device 3 according to some embodiments of the present invention may include a cell block 300 which has a cell array 310, an X-decoder 320, and a Y-decoder 330. The cell array 310 includes a plurality of memory cells 305 arranged in the X-direction and the Y-direction on a semiconductor substrate 302, the X-decoder 320 includes a decoder circuit 322 for selecting a word line extending in the X-direction, and the Y-decoder 330 includes a decoder circuit 332 for selecting a bit line extending in the Y-direction.

In order to realize high integration of the memory cells 305, the cell arrays 310 may be designed to have a stacked structure. For example, the cell arrays 310 may be stacked to form a four-layer-stacked structure. Since the cell arrays 310 have the stacked structure, the decoder circuits 322 may be designed to have a stacked structure or a horizontally-extended structure. For example, the X-decoders 320 include a plurality of horizontally-extended decoder areas so that the decoder circuits 322 having a horizontally-extended structure are arranged. Then, the size of the X-decoders 320 may extend in the X-direction. The same may be applied to the Y-decoders 330. Therefore, the size of the Y-decoders 330 may extend in the Y-direction.

For example, each of the cell arrays 310 has a horizontal side of length $L_5$ and a vertical side of length $L_6$ and may have a tetragonal shape with first to fourth vertexes 311 to 314. The X-decoder 320 may have a tetragonal shape with a horizontal side of length $M_5$ and a vertical side of $L_6$. The Y-decoder 330 may have a tetragonal shape with a horizontal side of length $L_5$ and a vertical side of $M_6$.

For example, it is assumed that $L_5=L_1$, $L_6=L_2$, $M_5>M_1$, and $M_6>M_2$ to make a comparison to the cell block 100 in FIG. 2B. As discussed in Table 3, each of the cell arrays 310 has a square shape having an area of $L_5 \times L_6$, where $L_5=L_6$. The X-decoder 320 has a rectangular shape having an area of $M_5 \times L_6$, where $M_5<L_6$. The Y-decoder 330 has a rectangular shape having an area of $L_5 \times M_6$ where $M_6(=M_5)<L_5(=L_6)$. The X-decoder 320 and the Y-decoder 330 has the same area. In addition, the X-decoder 320 comes in contact with the right side connecting the second vertex 312 of the cell array 310 to the third vertex 313 thereof. The Y-decoder 330 comes in contact with the lower side connecting the third vertex 313 of the cell array 310 to the fourth vertex 314 thereof. The cell block 300 has "a reversed L shape" or "an L shape" which is the same symmetric structure as the cell block 100 illustrated in FIG. 2B. The area $L_5 \times L_6$ of the cell array 310 is equal to the area $L_1 \times L_2$ of the cell array 110. The X-decoder 320 and the Y-decoder 330 have the sizes (areas) larger than the X-decoder 120 and the Y-decoder 130, respectively.

TABLE 3

|  | HORIZONTAL | VERTICAL | AREA | SHAPE |
| --- | --- | --- | --- | --- |
| CELL ARRAY 310 | $L_5$ | $L_6 (=L_5)$ | $L_5 \times L_6$ | SQUARE |
| X-DECODER 320 | $M_5$ | $L_6$ | $M_5 \times L_6$ | RECTANGULAR |
| Y-DECODER 330 | $L_5$ | $M_6 (=M_5)$ | $L_5 \times M_6$ ($M_5 \times L_6$) | RECTANGULAR |

Figure 4C:
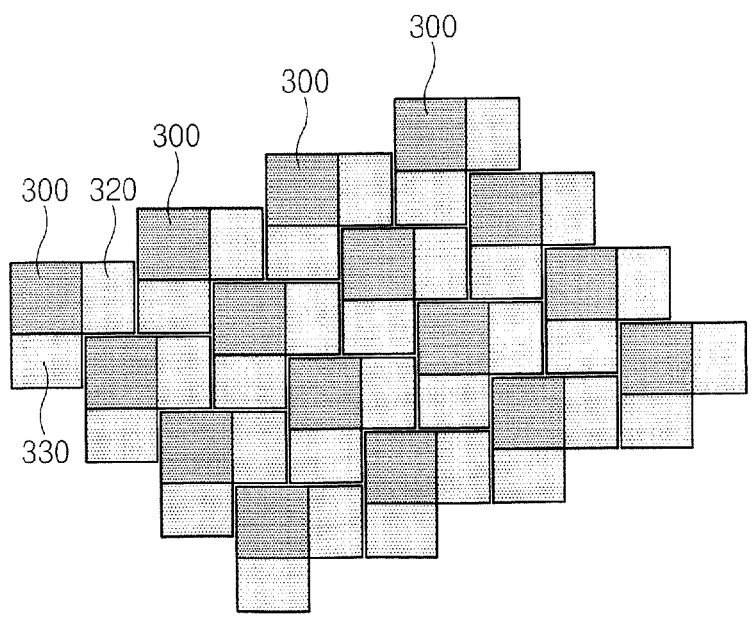

FIG. 4C is a plan view illustrating the closely packed arrangement of the plurality of cell blocks according some embodiments of the present invention. As illustrated in FIG. 4C, the plurality of cell blocks 300 may be closely arranged without an empty area between the cell blocks, when the arrangement is conducted in the way described with reference to FIGS. 2C to 2E. As a consequence, the high packing density may be realized, even when the cell arrays 310 are stacked and thus the size (area) of the X-decoder 320 and the Y-decoder 330 may increase. This is because there is no restriction on the length in the closely packed arrangement, unlike the conventional art, even when the size of the cell block 300 is different from the cell block 100 illustrated in FIG. 2B.

Figure 5A:
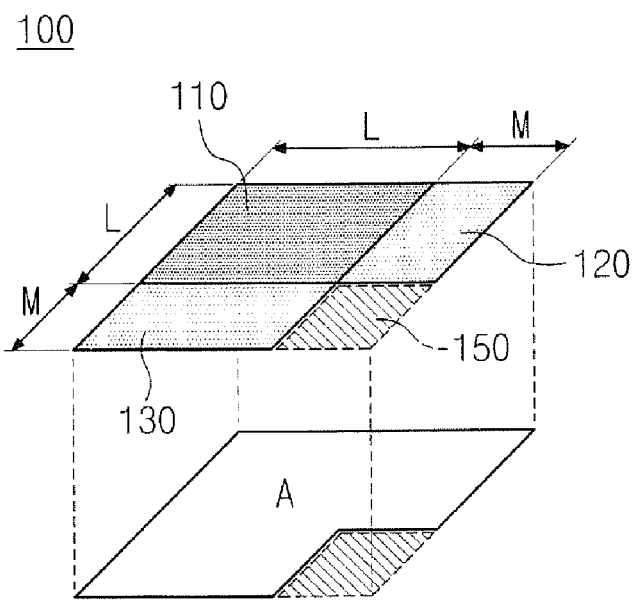
FIG. 5A is a perspective view illustrating the cell block having an L shape according to some embodiments of the present invention.
Figure 5A:
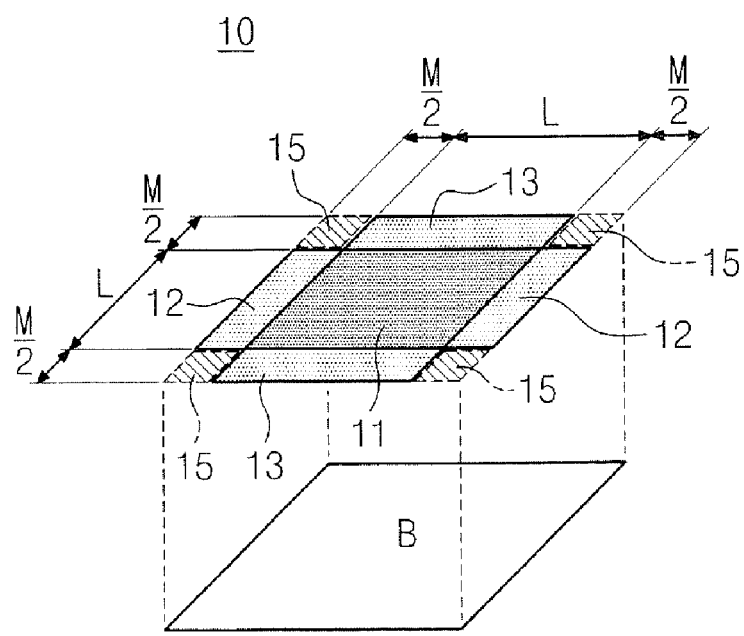

FIG. 5A is a perspective view illustrating embodiments where the cell block having an L shape according to some embodiments of the present invention is compared to a conventional cell block having the crossed-shape.

FIG. 5A illustrates the cell block 100 having the L-shape illustrated in FIG. 2B and the cell block 10 having the existing cross-shape illustrated in FIG. 1B. It is assumed that the cell array 110 has the same area as the cell array 11, the X-decoder 120 has the same area as the X-decoder 12, and the Y-decoder 130 has the same area as the Y-decoder 13.

In the, L-shaped cell block 100 of some embodiments of the present invention, when the cell array 110 has a square shape with the area of L×L and the X-decoder 120 and the Y-decoder 130 have a rectangular shape with the area of M×L, respectively, an area A of the L-shaped cell block 100 is calculated as follows:

$$A=(L+M)^2-M^2 \qquad \text{Expression 1}$$

In Expression 1, an area $M^2$ of a shaded region 150 is not included in the area A of the L-shaped cell block 100, as illustrated in FIGS. 4A to 4C.

In the cross-shaped cell block 10 of the conventional art, when the cell array 11 has the square shape with the area of L×L and the X-decoder 12 and the Y-decoder 13 have the rectangular shape with the area of 2×(M/2×L)=M×L, an area B of the cross-shaped cell block 10 is calculated as follows:

$$B=(L+M)^2 \qquad \text{Expression 2}$$

In Expression 2, shaded regions 15 are included in an area B of the cross-shaped cell block 10, as illustrated in FIG. 1B.

Comparing Expression 1 to Expression 2, the L-shaped cell block 100 according to some embodiments of the present invention may benefit area as large as $M^2$ as compared to the cross-shaped cell block 10 of the conventional art. The following Expression 3 shows an area reduction ratio A/B, in terms of % numeral value, between the L-shaped cell block 100 and the cross-shaped cell block 10.

$$A/B = \frac{\{(L+M)^2 - M^2\}}{\{(L+M)^2\}} \qquad \text{Expression 3}$$

-continued $$= \frac{\{(1+M/L)^2 - (M/L)^2\}}{(1+M/L)^2}$$

Figure 5B:
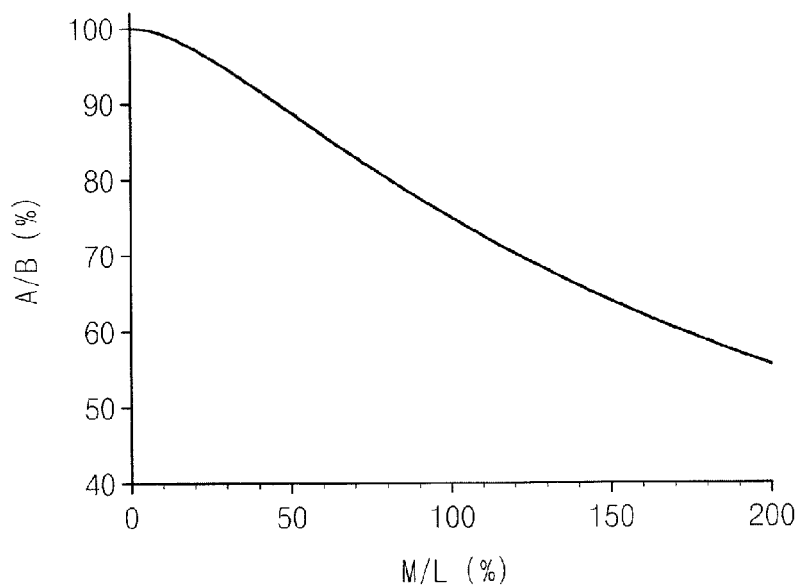
FIG. 5B is a graph illustrating a size of the cell block decreases as the size of a decoder increases in the cell block with the L shape according to some embodiments of the present invention.

FIG. 5B illustrates graphically the area (size) reduction ratio, that is, an area (size) reduction ratio A/B of the L-shaped cell block 100 to the cross-shaped cell block 10 using M/L as a variable in Expression 3.

Referring to FIGS. 5B, the area reduction ratio A/B is about 88%, when the size M of the decoder is about 50% of the size L of the cell array. This means that the cell block 100 occupies about 88% of the area B occupied by the cell block 10 in the substrate when the value of M is set to about ½ of the value of L, and thus about 12% of the area may be reduced. The area reduction effect becomes larger as the M/L increases. For example, if the size L of the cell array is not changed, the area reduction effect is larger as the size M of the decoder increases. An example of obtaining the area reduction effect is a case where the size of the decoder is enlarged as the pitch decreases, as described with reference to FIG. 3B. Another example is a case where the size of the decoder is enlarged by stacking the cell arrays, as described with reference FIG. 4B. According to Expression 3, it can be known that the area reduction effect of the cell block 200 in FIG. 3B or the cell block 300 in FIG. 4B is larger than that of the cell block 100 in FIG. 2B when compared to the cell block 10.

Following Expression 4 is to calculate the area reduction ration (A/B), when the size of the decoder increases linearly by the stack of the cell arrays, as described with reference FIGS. 4A to 4C. Expression 4 can be obtained by substituting M/L by $kn/L_0$.

$$A/B = \frac{\{(1+kn/L_0)^2 - (kn/L_0)^2\}}{(1+kn/L_0)^2}$$
$$= \frac{\{(1+kn)^2 - (kn)^2\}}{(1+kn)^2}$$

Expression 4 where $L_0$ is a certain value (for example, 1) of L, n is the stacked number of cell arrays, and k is a percentage of the size M of the decoder to the size L of the cell array.

Figure 5C:
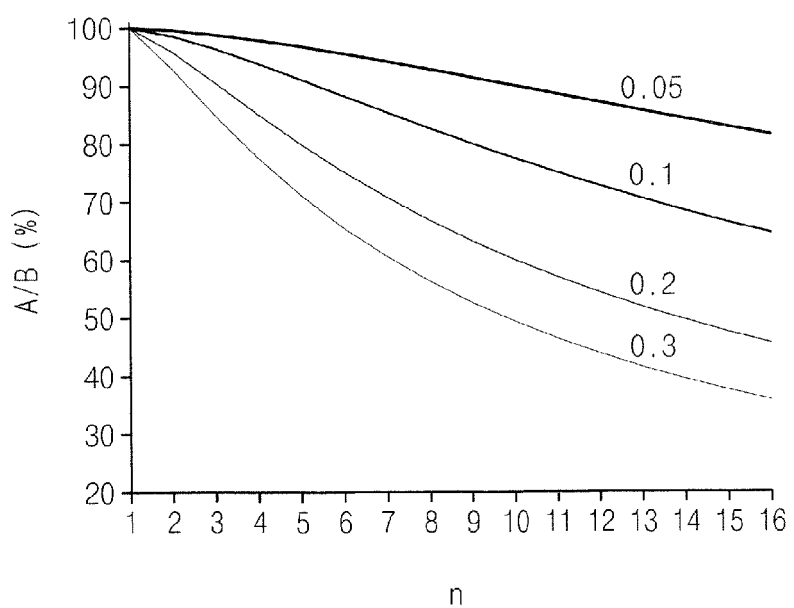
FIG. 5C is a graph showing that the size of the cell block decreases upon laminating cell arrays in the cell block with the L shape according to some embodiments of the present invention.

FIG. 5C illustrates graphically the area (size) reduction ratio (A/B), that is, the area (size) reduction ratio (A/B) of the L-shaped cell block 100 to the cross-shaped cell block 10 using the stacked number n of the cell arrays as a variable in Expression 4.

Referring to FIG. 5C, it may be known how many the area of the cell block is reduced in accordance with the stacked number n of cell arrays when values of k are about 0.05, 0.1, 0.2, and 0.3, that is, the sizes M of the decoder are about 5%, 10%, 20%, and 30% to the sizes L of the cell array, respectively. For example, the area reduction effect is obtained by about 50% as compared to the conventional art, when the size M of the decoder to the size L of the cell array is about 20% and the stacked structure of 14-layered cell arrays is embodied. It may be understood that as the more number n of cell arrays are stacked, the area of the decoder increases and thus the area reduction effect is more apparent, as illustrated in FIG. 4B.

FIGS. 6A, 7A, 8A, and 9A are plan views illustrating cell blocks according to some embodiments of the present invention. FIGS. 6B, 7B, 8B, and 9B are plan views illustrating the closely-packed arranged cell blocks according to some embodiments of the present invention.

Figure 6A:
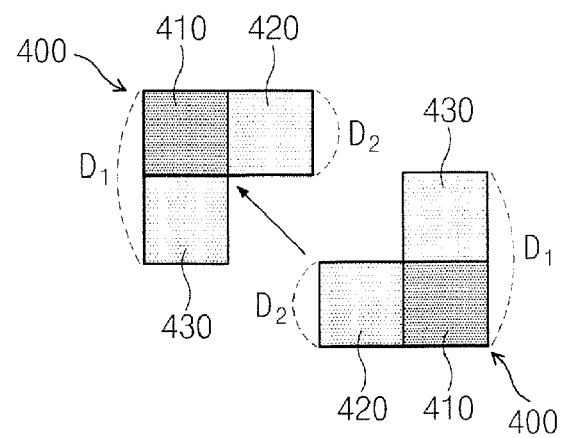
FIGS. 6A, 7A, 8A, and 9A are plan views illustrating cell blocks according to some embodiments of the present invention.
Figure 6B:
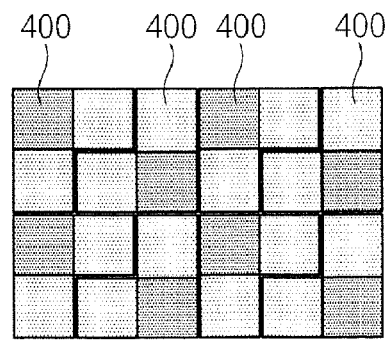
FIGS. 6B, 7B, 8B, and 9B are plan views illustrating the closely arranged cell blocks according to some embodiments of the present invention.

Referring to FIG. 6A, a cell block 400 according includes a cell array 410, an X-decoder 420 coming in contact with the right side of the cell array 410, and a Y-decoder 430 coming in contact with the lower side of the cell array 410. The cell block 400 may have an L-shaped symmetric structure where the size of the X-decoder 420 is the same as that of the Y-decoder 430. For example, the cell array 410 may have a square shape. The X-decoder 420 and the Y-decoder 430 may have a square shape having the same area as the cell array 410. Therefore, the lengths of both opposite sides of the cell block 400 may be 2 to 1. For example, one side $D_1$ of the cell block 400 may be a double of the other side $D_2$ ($D_1:D_2$=2:1). Since the cell blocks 400 satisfy the length condition of $D_1:D_2$=2:1, one of two cell blocks 400 may be reversely arranged to be point-symmetric to the other cell block 400. For example, the X-decoder 420 and the Y-decoder 430 of a certain cell block 400 may come in contact with the X-decoder 420 of the reversed cell block 400. In this way, when a pair of cell blocks 400 are arranged to be point-symmetric one another, the closely-packed arrangement illustrated in FIG. 6B can be realized. For example, when the arrangement described with reference to FIGS. 2C to 2E is upon closely-packed arranging the cell blocks 400, the closely-packed arrangement may be realized without an empty space between the cell blocks 400.

Figure 7A:
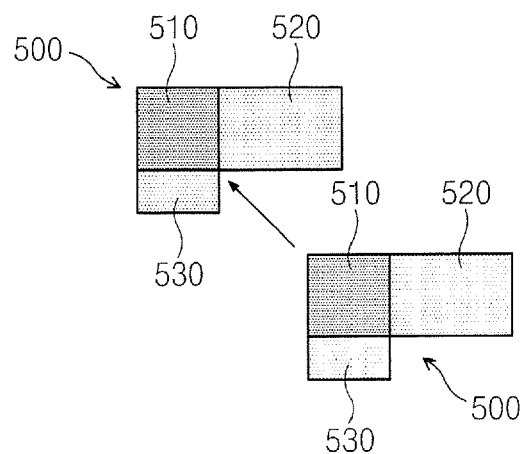
Figure 7B:
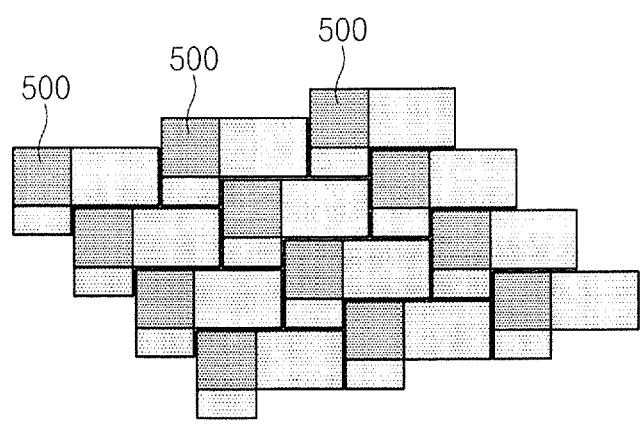

As illustrated in FIG. 7A, a cell block 500 includes a cell array 510, an X-decoder 520 coming in contact with the right side of the cell array 510, a Y-decoder 530 coming in contact with the lower side of the cell array 510. The cell array 510 may have an L-shaped asymmetric structure where the size of the X-decoder 520 is different from that of the Y-decoder 530. This asymmetric structure may be used in case where the area of the X-decoder 520 is different from that of the Y-decoder 530 since the word line of the cell array 510 is different in pitch from the bit line of the cell array 510. Even though the cell block 500 has the asymmetric structure, there is no restriction on the length in the closely-packed arrangement. Therefore, the closely-packed arrangement illustrated in FIG. 7B may be realized by applying the arrangement described with reference to FIGS. 2C to 2E.

Figure 8A:
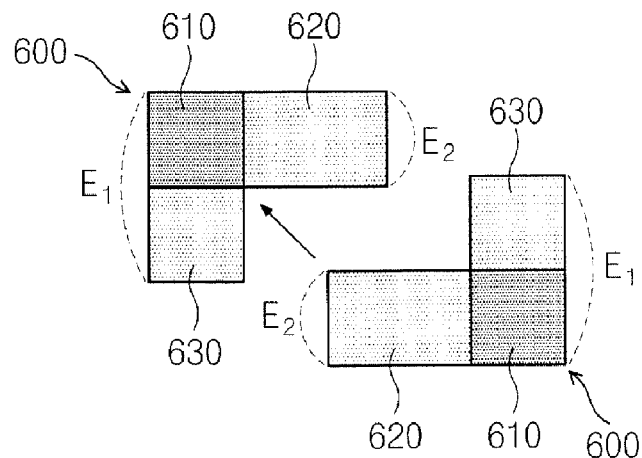
Figure 8B:
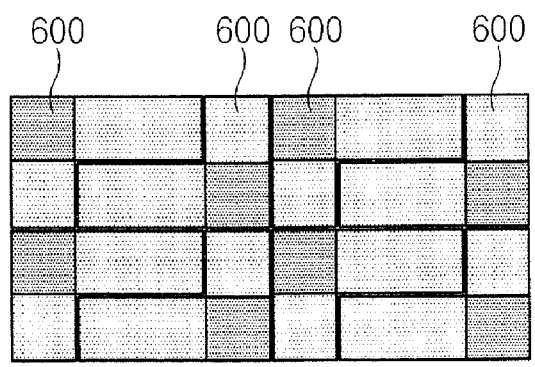

As illustrated in FIG. 8A, a cell block 600 may has an L-shaped asymmetric structure where the size of an X-decoder 620 is different from that of a X-decoder 630 since a word line is different in pitch from a bit line, like the cell block 500 in FIG. 7A. Unlike the cell block 500, one side $E_1$ of the cell block 600 may have a double length of that of the other side $E_2$. Since the cell blocks 600 satisfy the length condition of $E_1:E_2$=2:1, as described with reference to FIG. 6A, a pair of cell blocks 600 are arranged to be point-symmetric, so that the closely-packed arrangement illustrated in FIG. 8B may be realized. For example, by using the arrangement described with reference to FIGS. 2C to 2E, the plurality of cell blocks 600 are closely-packed arranged.

Figure 9A:
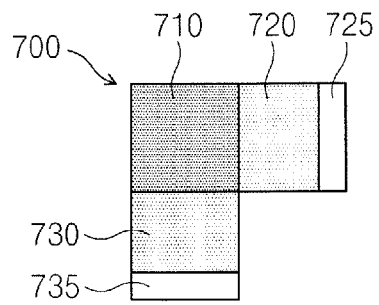

As illustrated in FIG. 9A, a cell block 700 includes a cell array 710, an X-decoder 720 coming in contact with the right side of the cell array 710, and a Y-decoder 730 coming in contact with the lower side of the cell array 710. The cell block 700 may have a symmetric structure or an asymmetric structure. The cell block 700 may further include so-called conjunction regions 725 and 735 where a connection circuit for connecting with a peripheral circuit such as a sense amplifier, a resistor, a buffer, or a driver is disposed. For example, the conjunction regions 725 and 735 include a first conjunction region 725 containing a connection circuit for selecting the X-decoder 720 and a second conjunction region 735 containing a connection circuit for selecting the Y-decoder 730.

In some embodiments, the first conjunction region 725 is disposed in parallel to the X-decoder 720 and the second conjunction region 735 is disposed in parallel to the Y-decoder 730. That is because the arrangement described with reference to FIGS. 2C to 2E are applicable by designing the entire configuration of the cell block 700 in an L shape. When the arrangement is used, the closely-packed arrangement illustrated in FIG. 9B may be obtained. The fact that the closely-packed arrangement of the cell blocks 700 is irrelevant to the symmetric structure of the cell block 700 is described above.

Figure 9B:
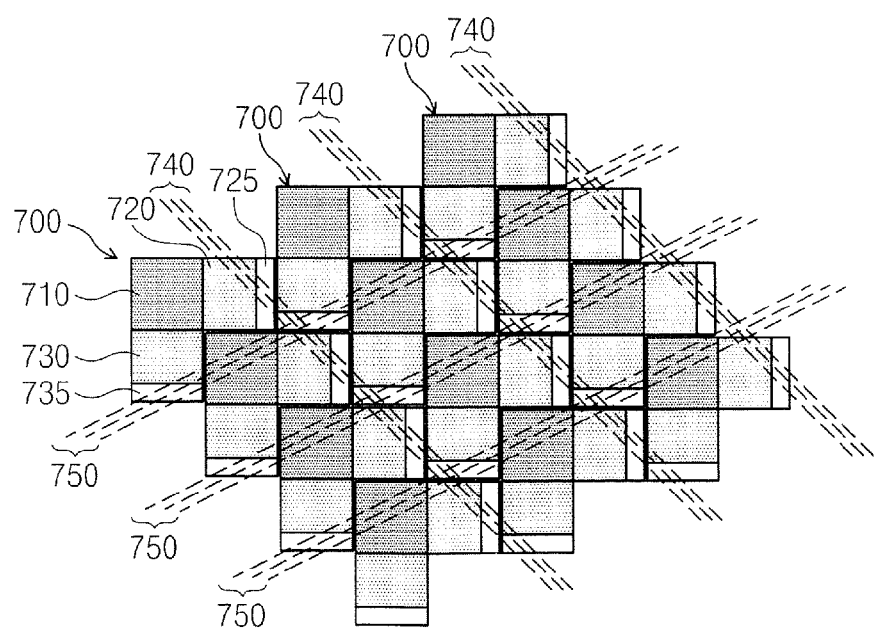

As illustrated in FIG. 9B, the peripheral circuits such as a sense amplifier or a resistant element may be electrically connected to the conjunction regions 725 and 735 by connection wirings 740 and 750 formed in a diagonal line shape. The connection wirings 740 and 750 may be disposed in areas higher than the areas where the cell arrays 710 are formed. For example, the first conjunction regions 725 may be connected to the first connection wirings 740 extending diagonally from the left upper side to the right lower side. The second conjunction regions 735 may be connected to the second connection wirings 750 extending diagonally from the left lower side to the right upper side. The first connection wiring 740 may be constituted by a plurality of wirings including a wiring for selecting the X-decoder 720 through the first conjunction region 725, an input/output (I/O) wiring, a wiring for transmitting other signals, and the forth. The second connection wiring 750 may be constituted by a plurality of wirings including a wiring for selecting the Y-decoder 730 through the second connection area 735, like the first connection wiring 740.

The first connection wiring 740 may select at least one of the plurality of X-decoders 720. The second connection wiring 750 may select at least one of the plurality of Y-decoders 730. Accordingly, the first and second connection wirings 740 and 750 may select one or more cell blocks 700 among the plurality of cell blocks 700. For example, the first connection wirings 740 may be disposed in a zigzag shape along the X-decoders 720 or the second connection wirings 750 may be disposed in a zigzag shape along the Y-decoders 750.

Figure 10A:
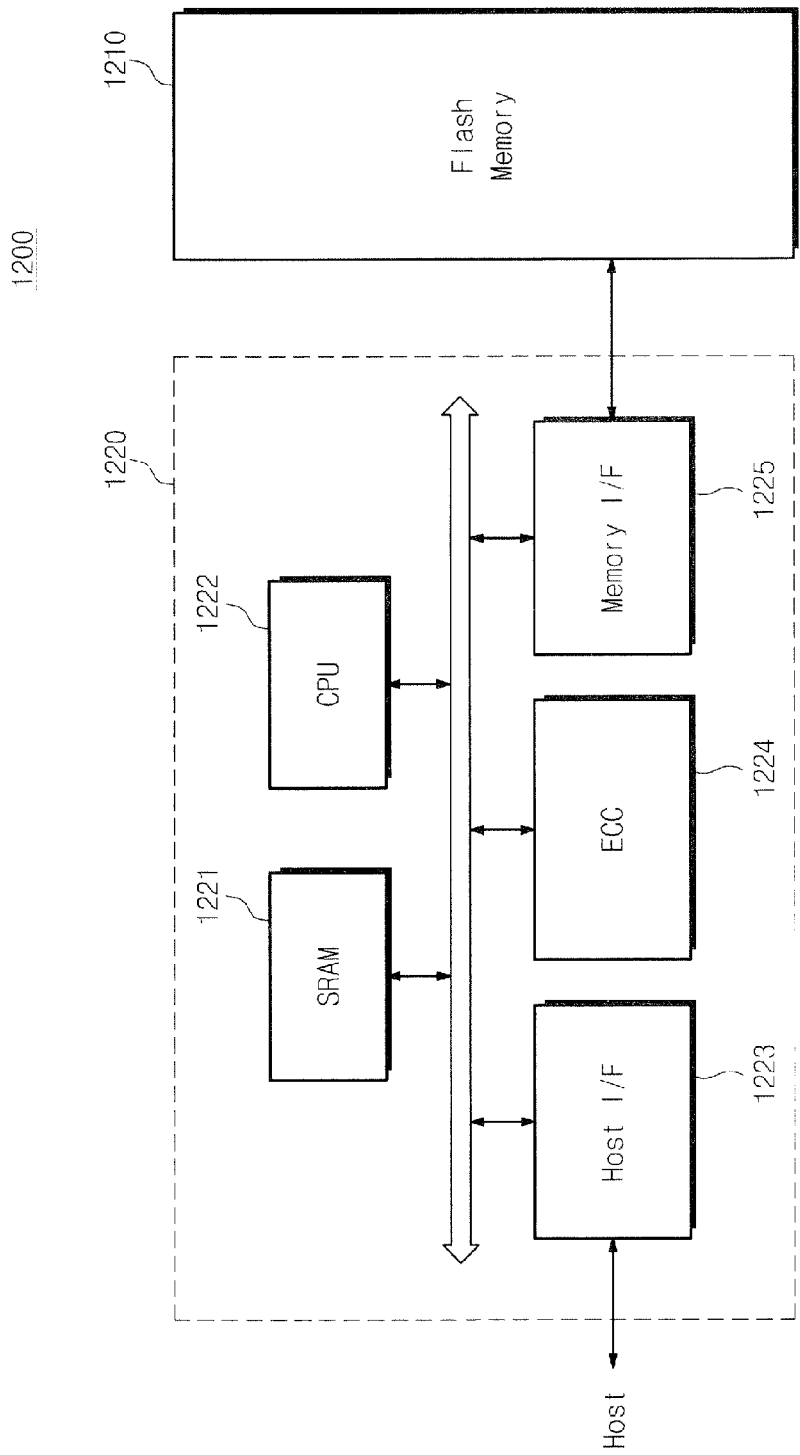
FIGS. 10A and 10B are block diagrams illustrating application of the semiconductor device according to various embodiments of the present invention.

FIG. 10A is a block diagram illustrating a memory card which has a memory element including cell blocks according to the various embodiments of the present invention. As illustrated in FIG. 10A, when cell blocks 100 to 700 according to the above-described various embodiments of the present invention are flash memory cell blocks, for example, a flash memory 1210 including the flash memory cell blocks may be applied to a memory card 1200. For example, the memory card 1200 includes a memory controller 1220 for controlling data exchange as a whole between a host and the flash memory 1210. An SRAM 1221 is used as an operation memory of a central processing unit 1222. A host interface 1223 has a protocol for exchanging data of the host connected to the memory card 1200. An error correction code 1224 detects and corrects errors contained in data read from the flash memory 1210. A memory interface 1225 interfaces the flash memory 1210. The central processing unit 1222 executes a control operation of exchanging data of the memory controller 1220 as a whole.

Figure 10B:
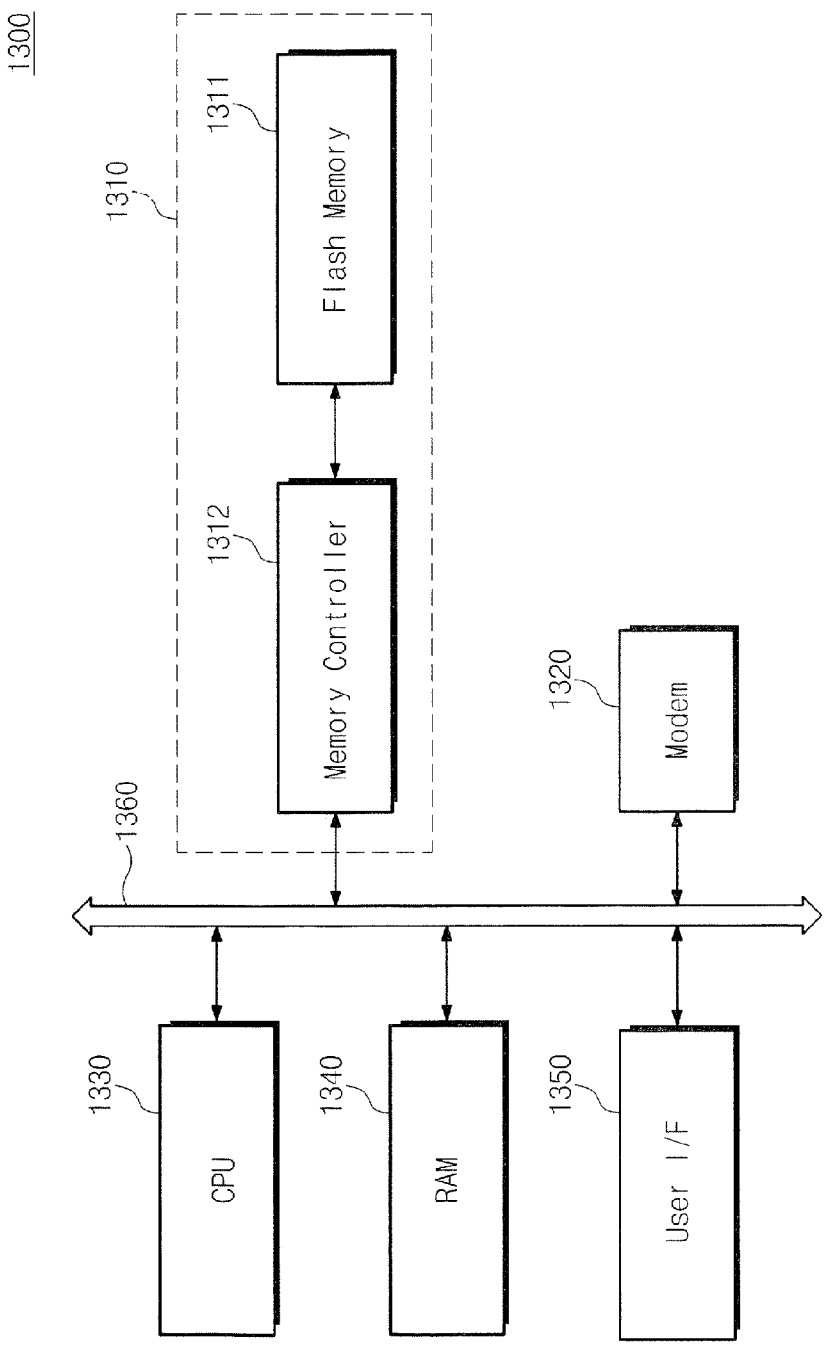

FIG. 10B is a block diagram illustrating an information processing system to which the memory device including the cell blocks according to various embodiments of the present invention is applied. As illustrated in FIG. 10B, the information processing system 1300 may include a flash memory system 1310 which has a flash memory including the above-described flash memory cell blocks. The information processing system 1300 includes a mobile apparatus or a computer. For example, the information processing system 1300 includes the flash memory system 1310, a modem 1320 electrically connected to each system bus 1360, a central processing unit 1330, a RAM 1340, and a user interface 1350. The flash memory system 1310 may store data processed by the central processing unit 1330 or data input from the outside. The information processing system 1300 may be provided as a solid static disk (SSD), a camera image sensor, and other application chipsets. For example, the flash memory system 1310 may be formed as the solid static disk. In these embodiments, the information processing system 1300 may store a mass data in the flash memory system 1310 stably and reliably.

According to some embodiments of the present invention, a high packing density may be realized without waste of a chip area by designing the cell blocks in the L shape and arranging cell blocks in a diagonal line without an empty area between the cell blocks. Moreover, since the cell blocks are closely arranged without restriction on the length of the cell blocks, an advantage of closely arranging the cell blocks can be obtained even when the pitches of the word line and the bit line are different from each other.

Embodiments of the present invention may be used in a manufacturing industry producing electronic apparatuses to which semiconductor memory devices are applicable, as well as, a semiconductor industry fabricating semiconductor memory devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
   a plurality of L-shaped cell blocks each including a cell array and a plurality of decoders disposed in horizontal and vertical directions of the cell array,
   wherein the plurality of L-shaped cell blocks are oriented in a diagonal direction intersecting the horizontal and vertical directions.

2. The semiconductor device of claim 1, wherein the cell array has a tetragonal shape with first to fourth vertexes which are sequentially arranged.

3. The semiconductor device of claim 2, wherein the decoder includes:
   a first tetragonal decoder which is disposed in the horizontal direction of the cell array to be adjacent to a side connecting the second vertex to the third vertex; and
   a second tetragonal decoder which is disposed in the vertical direction of the cell array to be adjacent to a side connecting the third vertex to the fourth vertex.

4. The semiconductor device of claim 3, wherein the cell block further includes:
   a first conjunction region which is disposed in the horizontal direction of the cell array to be adjacent to the first decoder and connects a peripheral circuit operating the cell block to the first decoder; and
   a second conjunction region which is disposed in the vertical direction of the cell array to be adjacent to the second decoder and connects the peripheral circuit to the second decoder.

5. The semiconductor device of claim 4, further comprising:
   a first wiring which is electrically connected to the first conjunction region to select the first decoder; and
   a second wiring which is electrically connected to the second conjunction region to select the second decoder.

6. The semiconductor device of claim 2, wherein a first vertex of one of two cell arrays closest to each other comes in contact with a third vertex of the other cell array to form the diagonal direction.

7. The semiconductor device of claim 1, wherein a ratio of the lengths of opposite sides in the plurality of L-shaped cell blocks is 2:1, and a pair of closest cell blocks in the plurality of L-shaped cell blocks are point-symmetric with each other.

8. A semiconductor device comprising:
   a plurality of memory cell blocks each having a memory cell array where a plurality of memory cells are arrayed and row and column decoders for accessing the memory cells, wherein the row and column decoders are disposed in horizontal and vertical directions of the memory cell array so that the plurality of memory cell blocks forms an L shape; and wherein any one of the plurality of L-shaped memory cell blocks comes in contact with the row and column decoders of another L-shaped memory cell block.

9. The semiconductor device of claim 8, wherein each of the plurality of L-shaped memory cell blocks further includes:

a first conjunction region which is disposed in the horizontal direction at one side of the row decoder to connect a peripheral circuit operating the memory cell block to the row decoder; and a second conjunction region which is disposed in the horizontal direction at one side of the column decoder to connect the peripheral circuit to the column decoder.

10. The semiconductor device of claim 9, further comprising:

a first wiring which is electrically connected to the plurality of first conjunction regions to select at least one of the plurality of row decoders; and a second wiring which is electrically connected to the plurality of second conjunction regions to select at least one of the plurality of column decoders.

11. The semiconductor device of claim 8, wherein the plurality of cell arrays are adjacent to each other in a diagonal direction intersecting the horizontal and vertical directions.

12. The semiconductor device of claim 8, wherein any one of the plurality of L-shaped memory cell blocks is point-symmetric to another L-shaped memory cell block.

* * * * *